(12) United States Patent
Corea et al.

(10) Patent No.: US 12,331,423 B2
(45) Date of Patent: Jun. 17, 2025

(54) REACTION CHAMBER FOR A DEPOSITION REACTOR WITH INTERSPACE AND LOWER CLOSING ELEMENT AND REACTOR

(71) Applicants: LPE S.P.A., Baranzate (IT); DENSO CORPORATION, Aichi-Pref (JP)

(72) Inventors: Francesco Corea, Baranzate (IT); Danilo Crippa, Baranzate (IT); Maurilio Meschia, Baranzate (IT); Silvio Preti, Baranzate (IT); Yuichiro Tokuda, Aichi-Pref (JP)

(73) Assignees: LPE S.P.A, Baranzate (IT); DENSO CORPORATION, Aichi-Pref (JP)

( * ) Notice: Subject to any disclaimer, the term of this patent is extended or adjusted under 35 U.S.C. 154(b) by 70 days.

(21) Appl. No.: 17/420,540

(22) PCT Filed: Jan. 7, 2020

(86) PCT No.: PCT/IB2020/050080
§ 371 (c)(1),
(2) Date: Jul. 2, 2021

(87) PCT Pub. No.: WO2020/144567
PCT Pub. Date: Jul. 16, 2020

(65) Prior Publication Data
US 2022/0074046 A1  Mar. 10, 2022

(30) Foreign Application Priority Data
Jan. 9, 2019  (IT) .................. 102019000000235

(51) Int. Cl.
*C30B 35/00* (2006.01)
*C23C 14/00* (2006.01)
(Continued)

(52) U.S. Cl.
CPC .............. *C30B 23/02* (2013.01); *C23C 14/00* (2013.01); *C23C 16/4411* (2013.01); *C30B 25/08* (2013.01)

(58) Field of Classification Search
CPC ......... C30B 23/00; C30B 23/02; C30B 23/06; C30B 25/00; C30B 25/02; C30B 25/08;
(Continued)

(56) References Cited

U.S. PATENT DOCUMENTS 4,715,317 A * 12/1987 Ishizuka ............... C01B 33/035
118/724
2016/0130721 A1* 5/2016 Chartier .................. C30B 29/06
117/223

FOREIGN PATENT DOCUMENTS

CN      202359230 U  *  8/2012
CN      203593622 U      5/2014
(Continued)

*Primary Examiner* — Kenneth A Bratland, Jr.
(74) *Attorney, Agent, or Firm* — Dickinson Wright PLLC; Andrew D. Dorisio

(57) ABSTRACT

The reaction chamber (100) is used for a deposition reactor of layers of semiconductor material on substrates; it comprises a tube (110) made of quartz and having a cylindrical shape and adapted to be positioned in use so that its axis (111) is vertical; the tube (110) has a cylindrical inner interspace (112) which extends along the entire length of the tube (110) and which is adapted to accommodate a flowing liquid; the chamber (100) further comprises an annular closing element (120) made of quartz and fixed to a first lower end of the tube (110) so as to close the interspace (112) preventing the liquid from flowing out of the interspace at the bottom; at the top, the closing element (120) has an annular recess (122) facing the interspace (112) so that the flowing liquid can reach the recess (122) at the bottom; the chamber (100) further comprises a set of internal conduits (130) internal to the interspace (112), wherein said internal (Continued)

Figure 5:
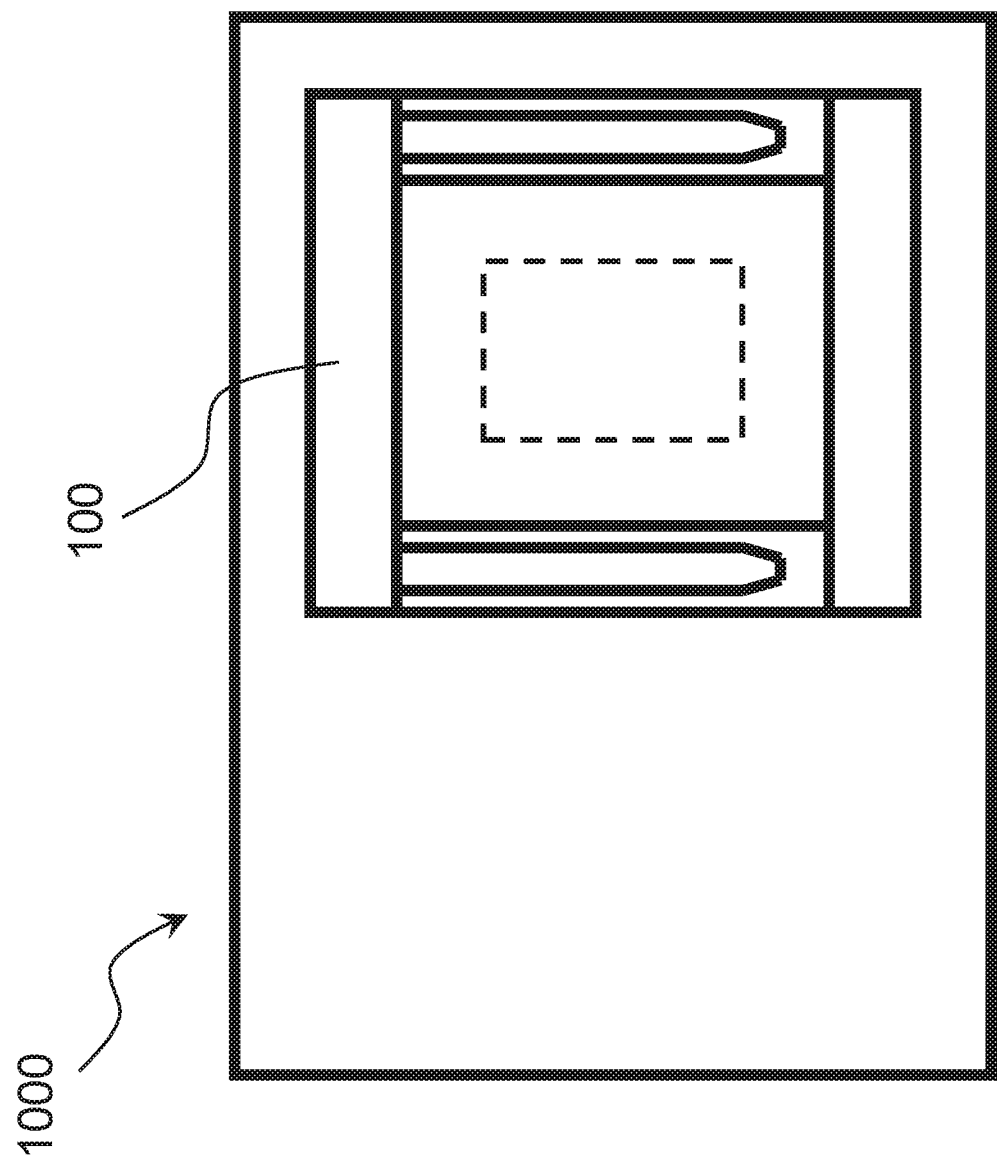

conduits (130) extend from the first lower region of the tube (110) till a second upper region of the tube (110) to facilitate circulation of the flowing liquid in the interspace (112).

24 Claims, 4 Drawing Sheets

(51) Int. Cl.
*C23C 16/44* (2006.01)
*C30B 23/02* (2006.01)
*C30B 25/08* (2006.01)

(58) Field of Classification Search
CPC ....... C30B 25/10; C30B 35/00; C30B 35/002; C23C 14/00; C23D 16/00; C23D 16/44; C23D 16/4411
USPC .... 117/84, 88, 109, 200, 204, 206; 118/715, 118/719, 726, 733
See application file for complete search history.

(56) References Cited

FOREIGN PATENT DOCUMENTS

| | | |
|---|---|---|
| CN | 204690170 U | 10/2015 |
| JP | S63166794 A | 7/1988 |
| JP | 05-109635 A | 4/1993 |
| JP | 07-126872 | 10/1995 |
| JP | 2009-035819 | 2/2009 |

\* cited by examiner

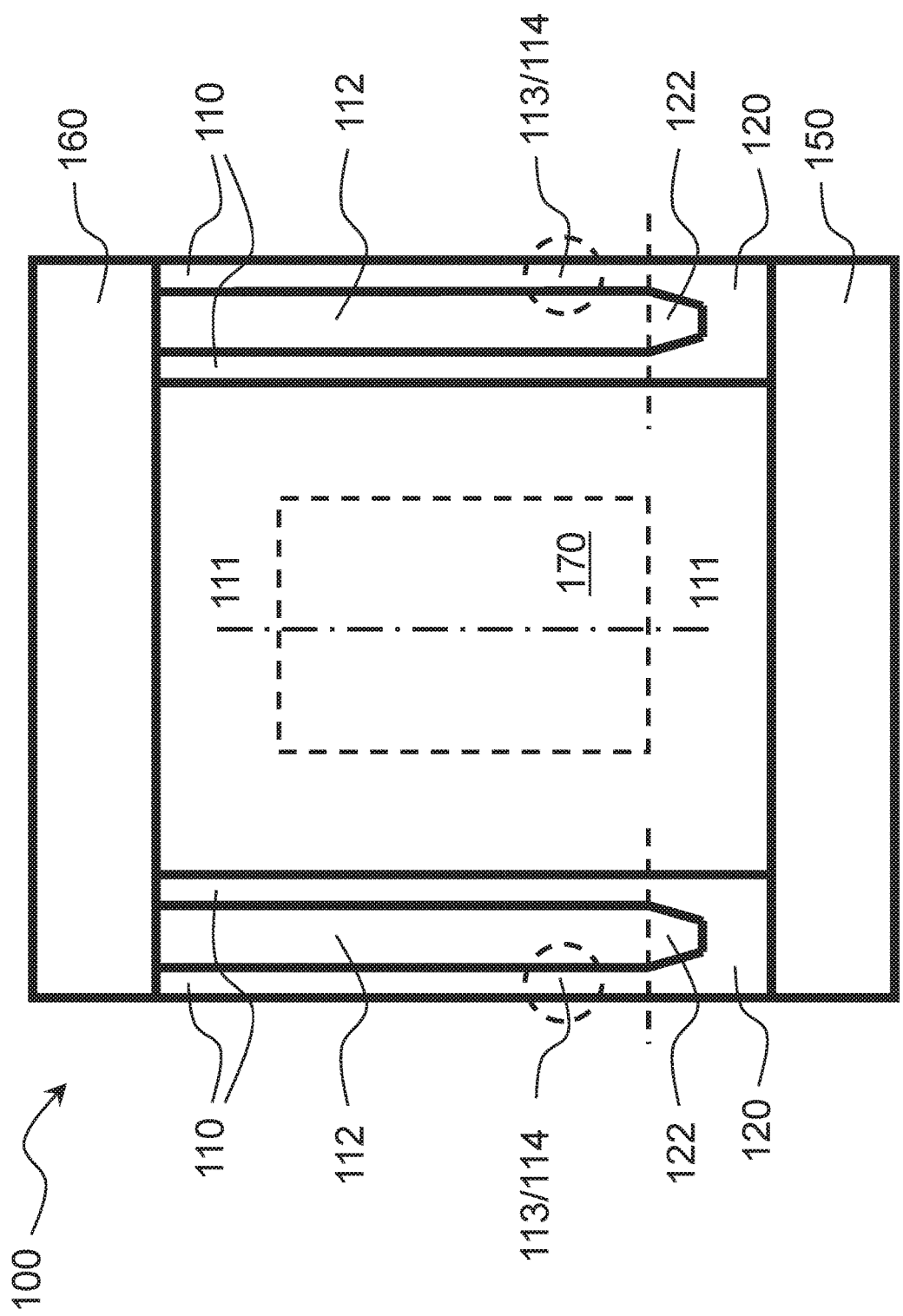

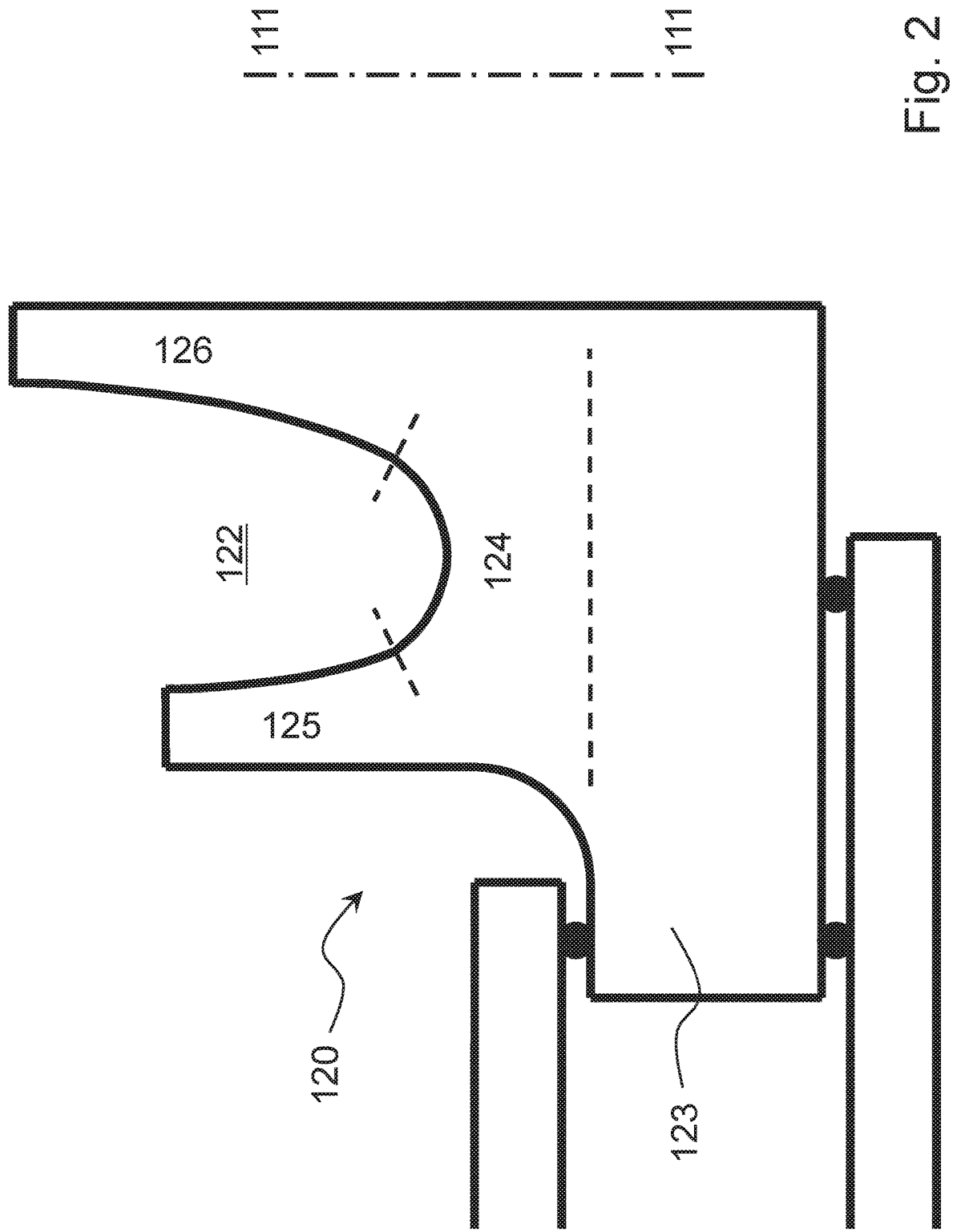

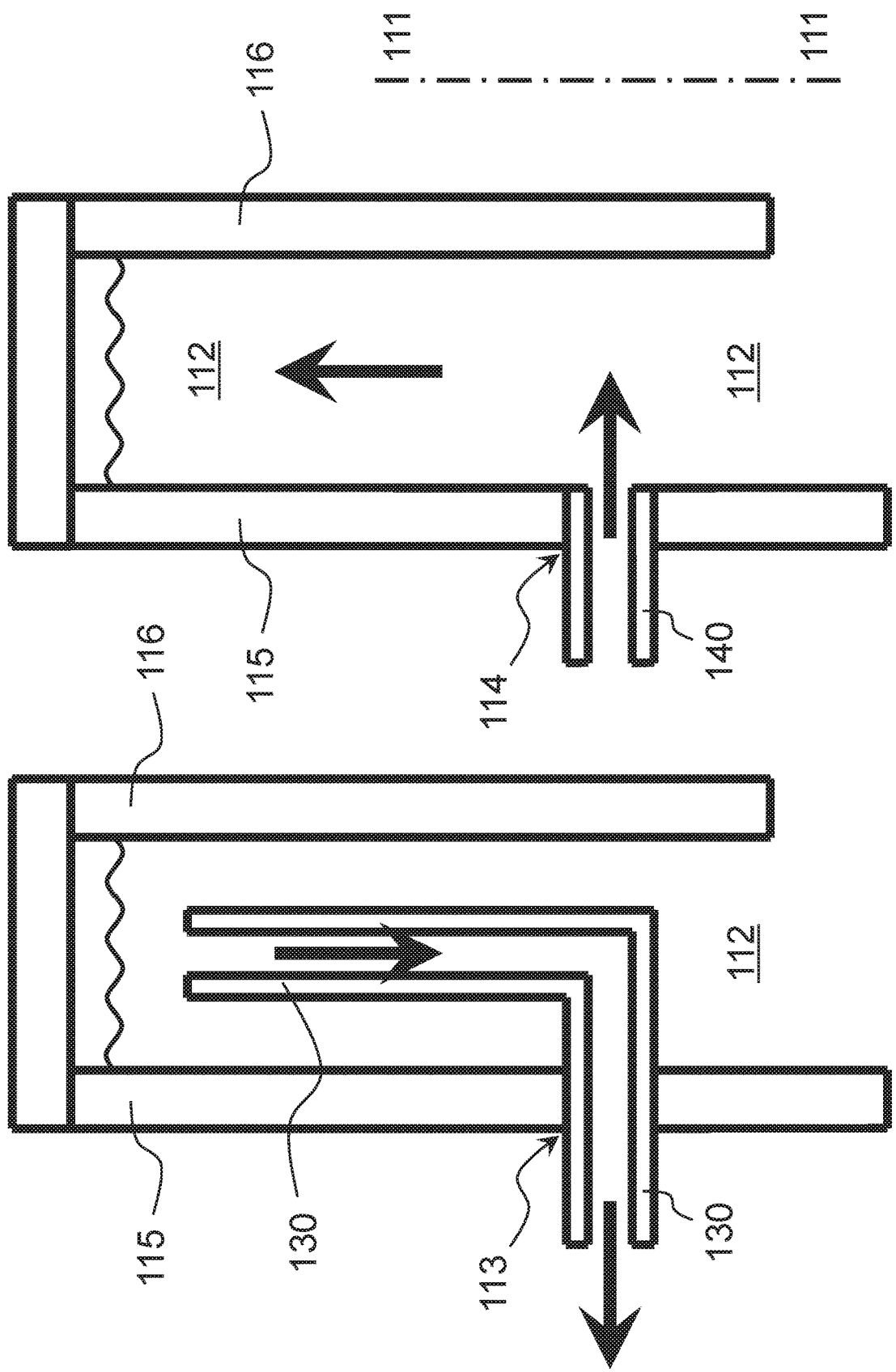

REACTION CHAMBER FOR A DEPOSITION REACTOR WITH INTERSPACE AND LOWER CLOSING ELEMENT AND REACTOR

FIELD OF THE INVENTION

The present invention relates to a reaction chamber for a deposition reactor with interspace and lower closing element and reactor that uses it.

STATE OF THE ART

The reaction chambers of the reactors require to be cooled when the reaction temperature (inside them is high).

This applies particularly, for example, to reactors for deposition of layers of semiconductor material on substrates, sometimes called "seeds", wherein the reaction temperature can be for example 800-1200° C. in the case of epitaxial deposition of silicon, and for example 1600-3000° C. in the case of epitaxial deposition of silicon carbide; the result of the deposition can be for example a (more or less thick) layer or an ingot (i.e. a long crystal).

It is desirable that the walls of the reaction chamber be effectively and uniformly cooled.

Furthermore, it is desirable that the cooling system operates reliably, i.e. it will not fail.

The Applicant has focused on the reaction chambers comprising a tube made of quartz and having a cylindrical shape and adapted to be positioned in use so that its axis is vertical; in particular, the Applicant has focused on large-sized chambers (for example diameter greater than 50 cm and height greater than 100 cm).

These chambers are used, in particular, in reactors for the growth of silicon carbide ingots starting from "seeds" at a very high temperature, for example above 2000° C.

SUMMARY

The general object of the present invention is to provide an effective and reliable reaction chamber.

This general object is substantially reached thanks to what is expressed in the appended claims that form an integral part of the present description.

The subject matter of the present invention is also a reactor that uses such reaction chamber.

LIST OF FIGURES

The present invention shall become more readily apparent from the detailed description that follows to be considered together with the accompanying drawings in which:

FIG. 1 shows a longitudinal sectional view (very schematic) of an example of embodiment of a reaction chamber according to the present invention, FIG. 2 shows a partial longitudinal sectional view of a closing element of the reaction chamber of FIG. 1, FIG. 3 shows a first partial longitudinal sectional view (very schematic) of a tube of the reaction chamber of FIG. 1, FIG. 4 shows a second partial longitudinal sectional view (very schematic) of a tube of the reaction chamber of FIG. 1, and FIG. 5 shows a block diagram of a reactor according to the present invention which uses the reaction chamber of FIG. 1.

As can be easily understood, there are various ways of practically implementing the present invention which is defined in its main advantageous aspects in the appended claims and is not limited either to the following detailed description or to the appended claims.

DETAILED DESCRIPTION

FIGS. 1 to 6 all refer to the same example of embodiment of the present invention; reference 100 indicates a reaction chamber as a whole and reference 1000 indicates a reactor as a whole.

FIG. 1 shows the chamber 100 surrounding an internal reaction and deposition region 170; in the region 170, at least one substrate (not shown in the figure) is positioned which is typically supported by a support element (not shown in the figure) called "susceptor" especially when the element has not only the function of supporting, but also that of heating the substrate. A (more or less thick) layer is deposited on the substrate during a so-called "growth" process at high temperature. FIG. 1 shows none of the components inside the reaction chamber 100, it not being relevant for the purposes of the present invention.

The chamber 100 comprises a base 150, a cover 160 and perimeter walls; specifically, the perimeter walls consist of a tube 110 made of quartz and having a cylindrical shape and adapted to be positioned in use so that its axis 111 is vertical.

The tube 110 has a cylindrical inner interspace 112 which extends along the entire length of the tube 110 and which is adapted to accommodate a flowing liquid, in particular a cooling fluid.

A tube like tube 110 with interspace 112 is relatively easy to produce because it consists of two concentric cylindrical walls positioned concentrically; each of the two walls typically has a constant diameter along its entire length; the difference in the two diameters of the two walls from one another is little (for example the difference in diameter can be 20-60 mm); the thicknesses of the two walls can be equal to each other and uniform everywhere (the thickness can be 3-10 mm); one can be called "internal wall" (see element 116 in FIG. 3 and FIG. 4); one can be called "external wall" (see element 115 in FIG. 3 and FIG. 4). The production of the two quartz walls is however delicate taking into account that typically the diameter of the tube can be for example greater than 50 cm and the height of the tube can be for example greater than 100 cm.

The chamber 100 further comprises an annular closing element 120 made of quartz and fixed to a first lower end of the tube 110 so as to close the interspace 112 preventing the liquid from flowing out of the interspace at the bottom.

The fixing between the tube 110 and the element 120 is made in particular by welding; it is understood that these weldings (the one of the element 120 with the internal wall of the tube 110 and the one of the element 120 with the external wall of the tube 110) must be made with care to avoid risks of leakage of the liquid flowing especially inwards of the chamber 100, and they are preferably made in regions with low thermal stress and low mechanical stress.

At the top, the closing element 120 has an annular recess 122 facing the interspace 112 so that the flowing liquid can reach the recess 122 at the bottom. Preferably and as shown in FIG. 1, the width of the recess 122 corresponds to the width of the interspace 112 where the closing element 120 is in contact with the tube 110. In fact, the interspace 112

(full of liquid during the operation of the reactor) extends inside the element 120 according to continuous surfaces (i.e. without steps).

In this way, any particular conformations of the interspace (for mechanical and/or thermal and/or hydraulic reasons) are concentrated in the element 120 (and in its recess 122) which is easier to produce and process mechanically also due to the fact of being small in size (much smaller than tube 110). For example, the width thereof can be 25-50 mm and the height thereof can be 35-70 mm and the diameter thereof equal to that of the tube—see FIG. 2.

A particular configuration of the element 120 is shown in FIG. 2.

The radial cross-section profile of the recess 122 can comprise circle arcs with different radii, in particular a first radius (small, for example 5-15 mm) at the bottom 124 of the recess 122 and a second radius (large, for example 50-150 mm) greater than the first radius at the sides 125, 126 of the recess 122. It should be noted that the radius on the side 125 can be the same or different from the radius on the side 126. In FIG. 2, the bottom 124 is graphically distinct from the sides 125 and 126 by two thin dashed segments. The use of circle arcs of different radii allows for example to optimally distribute and discharge the stresses due to the weight of the liquid in the interspace of the cylindrical quartz tube; in fact, since the tube is typically large-sized and placed vertically, the overall weight of the liquid is high. The radial cross-section profile of the recess 122 can be such that the side 126 of the recess 122 and the side 125 of the recess end at different levels. In particular, the side 126 on a first side of the closing element 120 facing the axis 111 of the tube 110 end at a higher level (for example, 5-15 mm) with respect to a side 125 on a second side of the closing element 120 opposite to the first side of the closing element 120. The different level allows to facilitate the welding operation of the element 120 to the tube 110; the configuration of FIG. 2 is preferable because it allows to carry out both weldings from the outside by moving around the tube 110.

The closing element 120 can have a flange 123 at a second (lower) region of the closing element 120 non-in-contact with the tube 110; the flange 123 advantageously protrudes in the radial direction. This flange is typically used for fixing the quartz tube; FIG. 2 schematically shows the case in which the flange 123 is tightened between an upper element and a lower element in particular thanks to its radial projection; FIG. 2 also shows some sealing gaskets (corresponding to the black circles in the figure): a gasket is placed between the upper element and the upper surface of the protrusion of the flange and one or two gaskets are placed between the lower element and the bottom surface of the flange. In FIG. 2, the flange 123 is graphically distinct from the rest of the element 120 by a thin dashed segment even if the element 120 is preferably made in one piece.

An important aspect of the present invention is the circulation of the cooling liquid in the chamber, precisely within the perimeter walls of the chamber, which will be described below; in particular, conduits are provided inside the interspace which extend from the first lower region of the tube to a second upper region of the tube to facilitate the circulation of the flowing liquid.

The tube 110 has a plurality of openings 113, 114 for inlet and/or outlet of the flowing liquid into and/or out of the interspace 112; FIG. 1 shows possible positions of the openings 113 and 114 by means of two dashed circles.

Preferably, the openings 113 and 114 can be located (as shown in FIG. 1) circumferentially on an external surface of the tube 110. Preferably, the openings 113 and 114 can be located (as shown in FIG. 1) in a first lower region of the tube 110; these openings can be at a certain distance (for example 10-50 mm) from the lower end of the tube. For example, 3-10 openings 113 preferably equally spaced on a first circumference and 3-10 openings 114 preferably equally spaced on a second circumference can be provided for; the first circumference and the second circumference can be at the same level (as shown in FIG. 3 and FIG. 4) or at a slightly different level; the openings 113 and the openings 114 can alternate around the tube 110.

In the example of the figures (in particular FIG. 3 and FIG. 4), a set of internal conduits 130 made of quartz inside the interspace 112 extend from the openings 113, located in the first lower region of the tube 110, till a second upper region of the tube 110 (a small section of the conduits 130 is external to the interspace due to the "L" shape of the conduits 130); a first set of openings 113 of the plurality (in the lower region of the tube) are adapted to liquid outlet and are in communication with the set of internal conduits 130; a second set of openings 114 (in the lower region of the tube) are adapted to liquid inlet. The cooling liquid enters the interspace 112 at the bottom (in particular through conduits 140), flows upwards along the interspace 112, enters the internal conduits 130 at the top (at an extreme region of the interspace 112), flows downwards along the internal conduits 130, and exits from the internal conduits 130 at the bottom.

In the example of the figures (in particular FIG. 3 and FIG. 4), a set of external conduits 140 made of quartz external to the interspace 112 are in communication with the second set of openings 114 (differently from FIG. 4, a small section of the conduits 140 could be inside the interspace 112).

It can be seen from the figures, in particular from FIG. 3 and FIG. 4, that at the top the interspace 112 is closed by some closing element (which could correspond to the cover 160 shown in FIG. 1 or a special "plug") and there is a free surface of the liquid slightly spaced from the closing element. Alternatively, the interspace could be open at the top. It is preferable that the interspace is closed by some closing element in particular to avoid evaporation of the liquid.

According to an (indicative and not limiting) example, the wall 115 has a (typically uniform) thickness of 4-6 mm, the wall 116 has a (typically uniform) thickness of 4-6 mm, the interspace 112 has a (typically uniform) width of 15-30 mm, the conduits 130 have a (typically uniform) diameter of 10-20 mm and they are equidistant from the walls 115 and 116, the upper end of the conduits 130 is 20-50 mm from the upper end of the walls 115 and 116.

The circulation of the cooling liquid inside the perimeter walls of the chamber can also be made in a different way from that shown in FIG. 3 and FIG. 4, for example as described below.

The tube can have a first set of openings (in the lower region of the tube) for flowing liquid inlet into the interspace, similar to the openings 114 of the previous example.

The liquid enters the interspace at the bottom through the openings of this first set, flows upwards along the interspace and exits the interspace above.

This output can take place in a "weir" manner at the upper edge of the tube 110, preferably the upper edge of the external wall 115 (see FIG. 4), Alternatively, this output can take place through a second set of openings. In this case, the tube has a second set of openings (in the upper region of the tube) for liquid outlet out of the interspace, the openings of the second set can be located circumferentially on an external surface of the tube; the openings of the second set are located at a second upper region of the tube.

In both of these cases of upper liquid outlet out of the interspace, the walls of the tube are subjected to a greater pressure than in the case of lower liquid outlet out of the interspace (case of FIG. 3 and FIG. 4).

In both of these cases of upper liquid outlet out of the interspace, the pump that circulates the liquid is forced to do more work than in the case of lower liquid outlet out of the interspace (case of FIG. 3 and FIG. 4).

As already said, a reaction chamber like the chamber 100 is typically used in a reactor such as the reactor 1000 of FIG. 5.

A particularly advantageous application are the reactors for the growth of silicon carbide ingots starting from "seeds" at a very high temperature, for example above 2000° C.

The invention claimed is:

1. A reaction chamber for a reactor for deposition of layers of semiconductor material on substrates, comprising a tube made of quartz and having a cylindrical shape and adapted to be positioned in use so that its axis is vertical, wherein the tube has a cylindrical inner interspace which extends along the entire length of the tube and which is adapted to accommodate a flowing liquid; the chamber further comprising an annular closing element made of quartz and fixed to a first lower end of the tube so as to close the interspace preventing the liquid flow out of the interspace at the bottom; wherein the closing element has an annular recess facing the interspace so that the flowing liquid can reach the annular recess at the bottom;

the chamber comprising furthermore a set of internal conduits internal to the interspace, wherein said internal conduits stretch from a first lower region of the tube to a second upper region of the tube to facilitate circulation of the flowing liquid in the interspace, whereby flowing liquid flows in the interspace first outside of the internal conduits and then inside of the internal conduits.

2. The reaction chamber according to claim 1, wherein the width of the annular recess corresponds to the width of the interspace at a first region of the closing element in-contact with the tube.

3. The reaction chamber according to claim 1, wherein the radial cross-section profile of the recess comprises circle arcs with different radius, in particular a first radius at the bottom of the recess and a second radius greater than the first radius at the sides of the recess.

4. The reaction chamber according to claim 1, wherein the radial cross-section profile of the recess is such that a first side of the recess and a second side of the recess end at different levels.

5. The reaction chamber according to claim 4, wherein a first side of the recess on a first side of the closing element facing the axis of the tube end at a higher level with respect to a second side of the recess on a second side of the closing element opposite to the first side of the closing element.

6. The reaction chamber according to claim 1, wherein the closing element has a flange at a second region of the closing element non-in-contact with the tube.

7. The reaction chamber according to claim 1, wherein the tube has a plurality of openings for inlet and/or outlet of the flowing liquid into and/or out of the interspace, the openings being located circumferentially on a surface external to the tube at a first region of the tube at a level higher than the level of the closing element.

8. The reaction chamber according to claim 7, wherein a first set of openings of the plurality are adapted to an outlet for flowing liquid and are in communication with the set of internal conduits and a second set of openings of the plurality are adapted to an inlet for flowing liquid.

9. The reaction chamber according to claim 8, comprising a set of external conduits made of quartz external to the interspace, wherein the second set of openings are in communication with the set of external conduits.

10. The reaction chamber according to claim 1, wherein the tube has a first set of openings for flowing liquid inlet into the interspace, the openings of the first set being located circumferentially on an external surface of the tube, wherein the openings of the first set are located at a first lower region of the tube.

11. The reaction chamber according to claim 10, wherein the tube has a second set of openings for flowing liquid outlet out of the interspace, the openings of the second set being located circumferentially on an external surface of the tube, wherein the openings of the second set are located at a second upper region of the tube.

12. A reactor comprising a reaction chamber according to claim 1.

13. A reactor comprising a reaction chamber according to claim 2.

14. A reactor comprising a reaction chamber according to claim 3.

15. A reactor comprising a reaction chamber according to claim 4.

16. A reactor comprising a reaction chamber according to claim 5.

17. A reactor comprising a reaction chamber according to claim 6.

18. A reactor comprising a reaction chamber according to claim 7.

19. A reactor comprising a reaction chamber according to claim 10.

20. A reactor comprising a reaction chamber according to claim 11.

21. A reaction chamber for a reactor for deposition of layers of semiconductor material on substrates, comprising:
a tube made of quartz having a cylindrical shape and adapted to be positioned in use so that its axis is vertical, wherein the tube has a cylindrical inner interspace which extends along the entire length of the tube and which is adapted to accommodate a flowing liquid;
an annular closing element made of quartz and fixed to a first lower end of the tube so as to close the interspace preventing the liquid flow out of the interspace at the bottom, wherein the closing element has an annular recess facing the interspace so that the flowing liquid can reach the annular recess at the bottom; and
a set of conduits adapted to circulate flowing liquid in the interspace, wherein said set of conduits comprises at least one inlet and at least one outlet;
wherein said at least one inlet comprises a first conduit that crosses an outer surface of a wall of the tube but is not positioned within the interspace;
wherein said at least one outlet comprises a second conduit which crosses through the wall of the tube into the interspace and which extends from a first lower region of the interspace of the tube to a second upper region of the interspace of the tube, said at least one outlet adapted to facilitate liquid flow in the interspace, first outside of the second conduit and then inside of the second conduit.

22. The reaction chamber of claim 21, wherein the second conduit is L-shaped within the interspace.

23. The reaction chamber of claim 22, wherein the first conduit is rectilinear.

24. The reaction chamber of claim 21, wherein the first conduit and the second conduit intersect the wall of the tube at the same vertical height of the wall of the tube.

* * * * *